United States Patent
Lee et al.

(10) Patent No.: US 7,696,687 B2
(45) Date of Patent: Apr. 13, 2010

(54) ORGANIC ELECTROLUMINESCENT DISPLAY DEVICE WITH NANO-POROUS LAYER

(75) Inventors: Joon-Gu Lee, Suwon-si (KR);
Yoon-Chang Kim, Suwon-si (KR);
Young-Woo Song, Suwon-si (KR);
Sang-Hwan Cho, Suwon-si (KR);
Ji-Hoon Ahn, Suwon-si (KR);
Jong-Seok Oh, Suwon-si (KR);
So-Young Lee, Suwon-si (KR)

(73) Assignee: Samsung Mobile Display Co., Ltd., Yongin (KR)

( * ) Notice: Subject to any disclaimer, the term of this patent is extended or adjusted under 35 U.S.C. 154(b) by 711 days.

(21) Appl. No.: 11/165,549

(22) Filed: Jun. 24, 2005

(65) Prior Publication Data

US 2006/0006778 A1 Jan. 12, 2006

(30) Foreign Application Priority Data

Jun. 26, 2004 (KR) .................... 10-2004-0048659

(51) Int. Cl.
*H01J 1/62* (2006.01)
*H05B 33/00* (2006.01)
*H05B 33/14* (2006.01)

(52) U.S. Cl. .................. 313/506; 313/507; 313/508; 445/23; 257/98

(58) Field of Classification Search .......... 313/501–512
See application file for complete search history.

(56) References Cited

U.S. PATENT DOCUMENTS

| 6,476,550 | B1 * | 11/2002 | Oda et al. | 313/504 |
| 6,649,439 | B1 | 11/2003 | Nesnidal | |
| 6,828,589 | B2 * | 12/2004 | Sakata | 257/79 |
| 2002/0180348 | A1 * | 12/2002 | Oda et al. | 313/506 |
| 2003/0164496 | A1 * | 9/2003 | Do et al. | 257/40 |
| 2004/0084080 | A1 * | 5/2004 | Sager et al. | 136/263 |
| 2004/0183433 | A1 * | 9/2004 | Cho et al. | 313/504 |
| 2005/0023967 | A1 * | 2/2005 | Gotoh et al. | 313/504 |
| 2005/0077820 | A1 * | 4/2005 | Onishi et al. | 313/506 |

FOREIGN PATENT DOCUMENTS

| CN | 1441692 | 9/2003 |
| JP | 11-283751 | 10/1999 |
| JP | 2002110362 | 4/2002 |
| JP | 2002-158095 | 5/2002 |
| JP | 2003-133070 | 5/2003 |

(Continued)

OTHER PUBLICATIONS

Chinese Office Action dated Aug. 8, 2008.

*Primary Examiner*—Sikha Roy
*Assistant Examiner*—Tracie Green
(74) *Attorney, Agent, or Firm*—H.C. Park & Associates, PLC

(57) ABSTRACT

An organic EL display device, and a manufacturing method thereof, including a rear substrate, and an organic EL portion formed on a surface of the rear substrate. The organic EL portion includes a first electrode, an organic layer, and a second electrode sequentially stacked, and a nano-porous layer and a highly refractive layer are interposed between the rear substrate and the first electrode.

6 Claims, 4 Drawing Sheets

FOREIGN PATENT DOCUMENTS

| | | |
|---|---|---|
| JP | 2003-162923 | 6/2003 |
| JP | 2003-257620 | 9/2003 |
| KR | 10-2003-0026450 | 4/2003 |
| KR | 10-2003-0029467 | 4/2003 |
| KR | 1020030070985 | 9/2003 |
| WO | 0242797 | 5/2002 |

* cited by examiner

ORGANIC ELECTROLUMINESCENT DISPLAY DEVICE WITH NANO-POROUS LAYER

CROSS REFERENCE TO RELATED APPLICATION

This application claims priority to and the benefit of Korean Patent Application No. 10-2004-0048659, filed on Jun. 26, 2004, in the Korean Intellectual Property Office, which is hereby incorporated by reference for all purposes as if fully set forth herein.

BACKGROUND OF THE INVENTION

1. Field of the Invention

The present invention relates to an organic electroluminescent (EL) display device and method for manufacturing the same. More particularly, the present invention relates to an organic EL display device having improved light coupling efficiency.

2. Discussion of the Background

Generally, an organic EL display device is a self-emissive display that emits light by electrically exciting a fluorescent or phosphorescent organic compound. It may be thin, driven by a low voltage, and have a wide viewing angle and fast response speed. Hence, the EL display may solve problems found in existing liquid crystal displays. Therefore, it has attracted attention as a next-generation display.

A stack-type organic EL display device has been developed and commercialized as a green light emission display having an improved life span. Novel organic materials having a wide variety of molecular structures have been developed, and research into self emitting color display devices continues.

Generally, an organic EL display device is manufactured by forming an organic layer, having a predetermined pattern, between electrode layers on a glass or transparent insulating substrate. Examples of materials that may be used for the organic layer include copper phthalocyanine (CuPc), N,N'-Di(naphthalene-1-yl)-N,N'-diphenyl-benzidine (NPB), tris-8-hydroxyquinoline aluminum, and other like materials.

The organic EL display device forms an image based on the following principle. As positive and negative voltages are applied to electrodes, holes injected from an electrode, to which a positive voltage is applied, may move to an light emitting layer via a hole transport layer, and electrons may move from an electrode, to which a negative voltage is applied, to the light emitting layer via an electron transport layer. The electrons and the holes recombine in the light emitting layer, thereby generating excitons. The excitons transition from an excited state to a ground state, thereby provoking the light emitting layer's fluorescent molecules to emit light and form an image.

The organic EL display operating as described above has an internal light efficiency and an external light efficiency. The internal efficiency depends on the organic luminescent material's photoelectric conversion efficiency. The external efficiency, which may be referred to as light coupling efficiency, depends on the refractive index of the display's layers. Organic EL displays may have lower external efficiency than other displays, such as cathode-ray tubes (CRTs), plasma display panels (PDPs), and field emission displays (FEDs). Accordingly, such organic EL displays need to be improved in terms of various characteristics of displays, such as brightness and life span.

In an organic EL display device shown in FIG. 1, as taught by Lu et al., in APL 78 (13), p. 1927, 2001, according to incident angle, light generated from an organic layer may experience total internal reflection at an interface between an indium tin oxide (ITO) layer and glass and at an interface between glass and air. In conventional organic EL display devices, the light coupling efficiency is typically about 23% or less, and the remainder of the light is not seen since it cannot escape the device.

In this regard, various methods for enhancing the light coupling efficiency of an organic EL display device have been proposed. A variety of methods associated with using diffractive gratings have been recently researched and reported.

Japanese Patent Publication No. hei 11-283751 discloses an organic EL display comprising a diffraction grating or a zone plate in a component in an organic EL element having one or more organic layers between a cathode and an anode.

Such an organic EL device may be complicated to fabricate since irregularities may need to be formed on a surface of a substrate or a fine electrode pattern layer, or a separate diffraction grating may need to be provided, thereby making it difficult to attain efficient productivity. Also, forming an organic layer on the irregularities makes the layer rougher, which may deteriorate the organic EL device's durability and reliability.

Korean Patent Publication No. 2003-0070985 discloses an organic EL display device including a light loss preventing layer, which has different refractive index regions between relatively large refractive index layers, among layers including a first electrode layer, an organic layer, and a second electrode layer. Referring to FIG. 2, the organic EL display device has a diffraction grating formed on a substrate, and light incident on the substrate is diffracted at an angle smaller than a critical angle of total internal reflection to be externally transmitted.

However, the conventional organic EL display's external light coupling efficiency largely depends upon a difference in the refractive index between diffraction grating layers. That is, the greater the refractive index difference, the higher the light coupling efficiency. Typically, materials having a low refraction index, i.e., substantially 1, tend to absorb moisture, which makes it difficult to utilize such materials in the fabrication process.

SUMMARY OF THE INVENTION

The present invention provides an organic EL display device, and a manufacturing method thereof, which may be easily fabricated and have increased light coupling efficiency.

Additional features of the invention will be set forth in the description which follows, and in part will be apparent from the description, or may be learned by practice of the invention.

The present invention discloses an organic EL display device including a rear substrate, and an organic EL portion formed on a surface of the rear substrate and including a first electrode, an organic layer, and a second electrode. A nano-porous layer and a highly refractive layer are interposed between the rear substrate and the first electrode.

The present invention also discloses a method for manufacturing an organic EL display device including coating a photoresist composition on a rear substrate, exposing and developing the photoresist composition to form a nano-grating layer, coating a highly refractive layer on the nano-grating layer, and forming a nano-porous layer.

The present invention also discloses an organic EL display device, comprising a substrate, a nano-porous layer on the substrate, and a highly refractive layer on the nano-porous layer. The nano-porous layer and the highly refractive layer are interposed between the substrate and a light emitting layer.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

DETAILED DESCRIPTION OF THE ILLUSTRATED EMBODIMENTS

The present invention will now be illustrated in greater detail with reference to exemplary embodiments, but it should be understood that the present invention is not deemed to be limited thereto.

Figure 1:
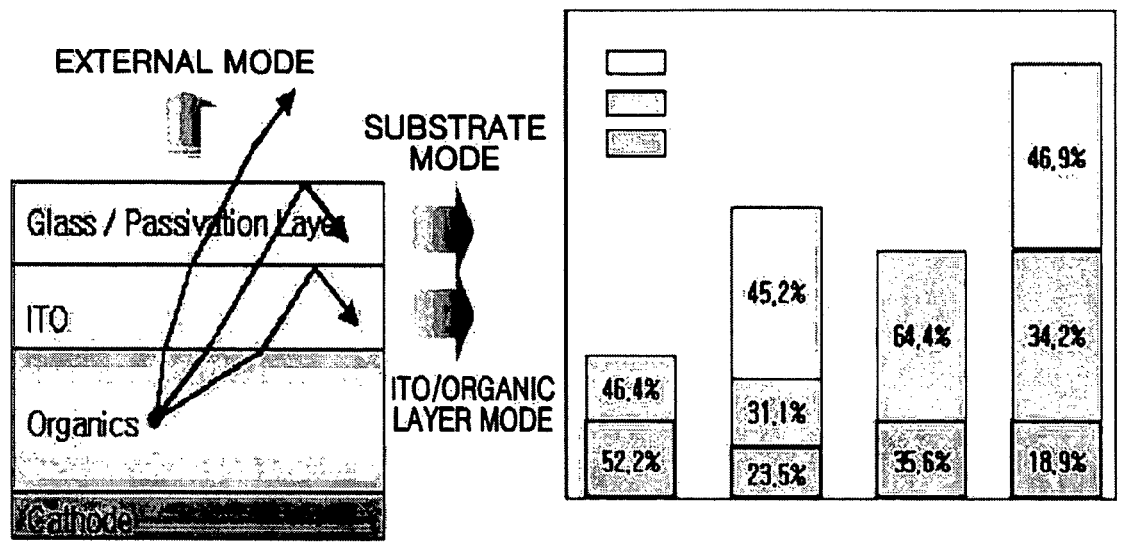
FIG. 1 schematically shows a reduction of light coupling efficiency in a conventional organic EL display device.
Figure 2:
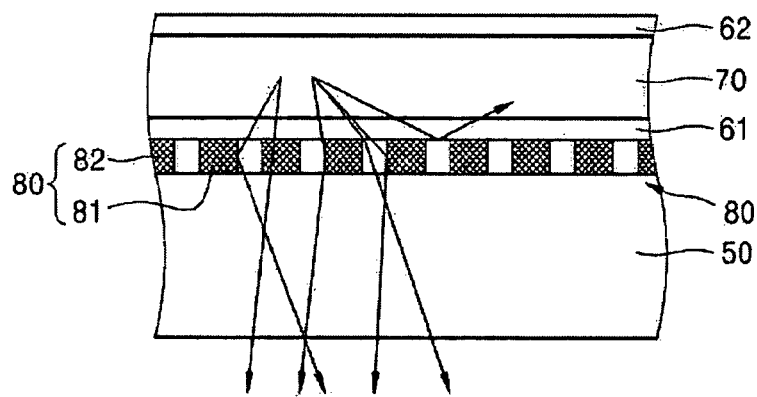
FIG. 2 is a schematic diagram showing a conventional organic EL display device having a diffraction grating.
Figure 3:
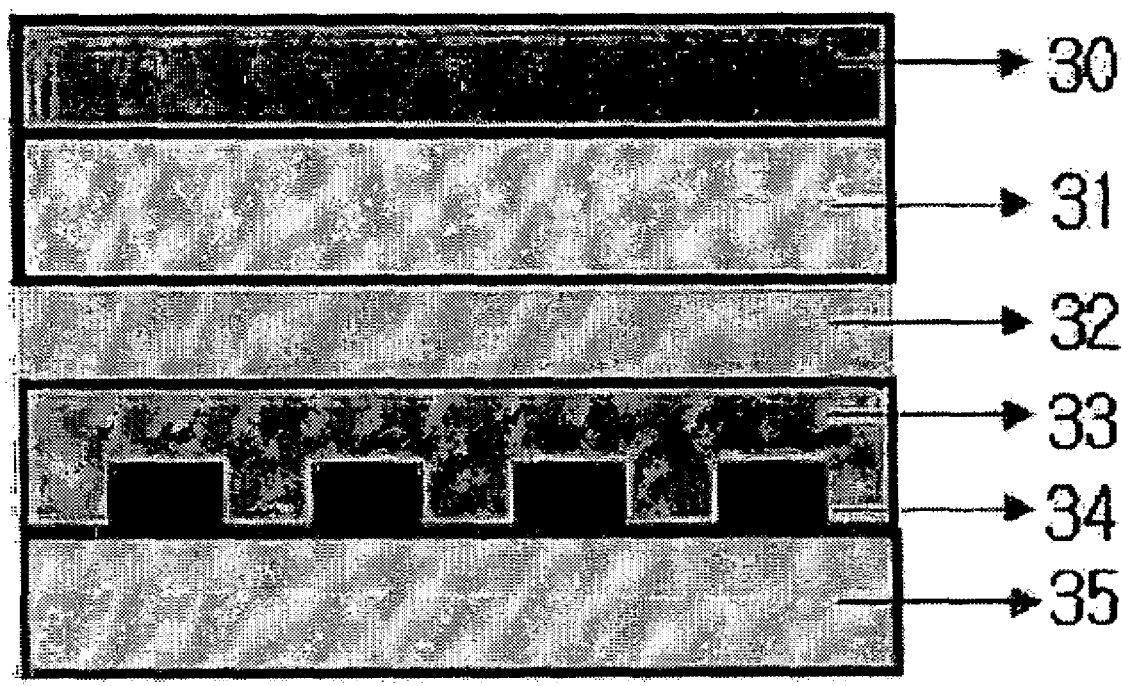
FIG. 3 is a schematic cross-sectional view of an organic EL display device according to an exemplary embodiment of the present invention.

FIG. 3 shows an exemplary organic EL display device according to the present invention.

Referring to FIG. 3, the organic EL display device according to the present invention may include a first electrode 32, an organic layer 31, and a second electrode 30 sequentially stacked on a rear substrate 35 made of glass, and a nano-porous layer 34 and a highly refractive layer 33, as diffraction grating layers, may be interposed between the rear substrate 35 and the first electrode 32. Because a greater refractive index difference between diffraction grating layers may increase light coupling efficiency, the organic EL display device according to the present invention employs a highly refractive layer and a nano-porous layer having a refractive index of 1.0 as diffraction grating layers, thereby solving the prior art problem due to the hygroscopic property of low refractive index materials while significantly enhancing light coupling efficiency.

In the organic EL display device according to the present invention, the light coupling efficiency is enhanced based on the following principle.

That is, in the organic EL display device shown in FIG. 3, when a predetermined voltage is applied to either the first electrode 32 or the second electrode 30, holes injected from the first electrode 32, as a positive electrode, may move to a light emitting layer (not shown) via a hole transport layer (not shown) in the organic layer 31, while electrons may move from the second electrode 30 to the light emitting layer (not shown) via an electron transport layer (not shown) in the organic layer 31. The electrons and holes recombine in the light emitting layer to generate exitons, which transition from an excited state to a ground state, resulting in light emission by phosphorescent molecules in the light emitting layer. Here, the emitted light is externally transmitted through the transparent first electrode 32 and the substrate 35. Forming the nano-porous layer 34 and the highly refractive layer 33 between the substrate 35 and the first electrode 32 may prevent loss of light due to interfacial reflection.

In other words, when the refractive index of the organic layer 31 or the first electrode 32 is higher than that of the glass forming the rear substrate 35, light may be reflected at an interface between the rear substrate 35 and the organic layer 31 or the first electrode 32. However, since the nano-porous layer 34 and the highly refractive layer 33, having different refractive indexes, are formed between the first electrode 32 and the rear substrate 35, the refractive index difference between the nano-porous layer 34 and the highly refractive layer 33 scatters light, thereby preventing interfacial reflection. In particular, the nano-porous layer 34 and the highly refractive layer 33 scatter light incident from the emitting layer at an angle greater than a critical angle so that an angle of incidence is reduced to less than the critical angle, thereby significantly suppressing the interfacial reflection of light.

Additionally, layers of two materials having different refractive indexes (i.e. the nano-porous layer 34 and the highly refractive layer 33), are sandwiched so that the mean refraction index between the two layers adjusts the refractive index to increase an angle of total internal reflection. Consequently, an anti-reflection effect may significantly increase the light coupling efficiency.

The nano-porous layer 34 may be about 1000 nm or less thick. If it is thicker than 1000 nm, the enhanced optical coupling efficiency may not be so high.

Additionally, the highly refractive layer 33 may be about 2000 nm or less thick. If it is thicker than 2000 nm, the light coupling efficiency and processability may both be poor.

In order to maximize the light coupling efficiency, the highly refractive layer 33 may have a refractive index of 1.6 or greater so that a refractive index difference between the highly refractive layer 33 and the nano-porous layer 34 is at least 0.6. If the refractive index difference between the highly refractive layer 33 and the nano-porous layer 34 is less than 0.6, the scattering efficiency at an interface therebetween may be reduced, which increases the reflection of light incident from the organic layer, undesirably resulting in reduced light coupling efficiency. In this regard, a material selected from the group consisting of SOG (Spin-On-Glass), $TiO_2$, and $Ta_2O_5$ may be used as the highly refractive layer 33.

The nano-porous layer 34 may include a nano-porous grating arranged regularly at an interval of about 200 nm to about 1000 nm. A width of the nano-porous grating may be in a range of about 10% to about 90% of the interval, which is a range of about 20 nm to about 900 nm. If the nano-porous grating is arranged with a cyclic period that is shorter than the interval, (e.g., 200 nm or less), or greater than 1000 nm, the nano-porous grating may not be perceived by light, so that enhanced light coupling may not be achievable. Additionally, if the nano-porous grating is too narrow or too wide, the light coupling efficiency may be noticeably reduced.

An organic EL portion including the first electrode 32, the organic layer 31 and the second electrode 30 may be manufactured by a known method commonly used in the art.

The first electrode 32, which may be a positive electrode (anode) formed on a transparent substrate, may be made of ITO, and it may include a plurality of striped electrodes arranged in parallel with each other.

The organic layer 31 may include a hole injecting layer, a hole transport layer, a light emitting layer, and an electron injecting layer sequentially stacked from the top surface of the first electrode 32. The organic layer 31 may be formed of a low-molecule organic compound, such as 8-hydroxyquinolino-aluminum ($Alq_3$) or a polymeric organic compound such as poly(p-phenylenevinylene) or poly(2-methoxy-5-(2'-ethylhexyloxy)-1,4-phenylenevinylene).

The second electrode 30 may be made of a conductive metal, and it may include a plurality of striped electrodes orthogonal to the first electrode 32.

The organic EL display device according to exemplary embodiments of the present invention may be of a front emission type, a rear emission type, or a front and rear emission type. Additionally, both a passive matrix (PM) driving method and an active matrix (AM) driving method may be used as the driving method for the organic EL device.

Another exemplary embodiment of the present invention provides a method for manufacturing an organic EL display device comprising coating a photoresist composition on a rear substrate, exposing and developing the photoresist composition to form a nano-grating layer on the rear substrate, coating a highly refractive layer on the nano-grating layer, heating or wet-etching the nano-grating layer to form a nano-porous layer, and sequentially stacking a first electrode, an organic layer and a second electrode on the highly refractive layer.

Figure 4:
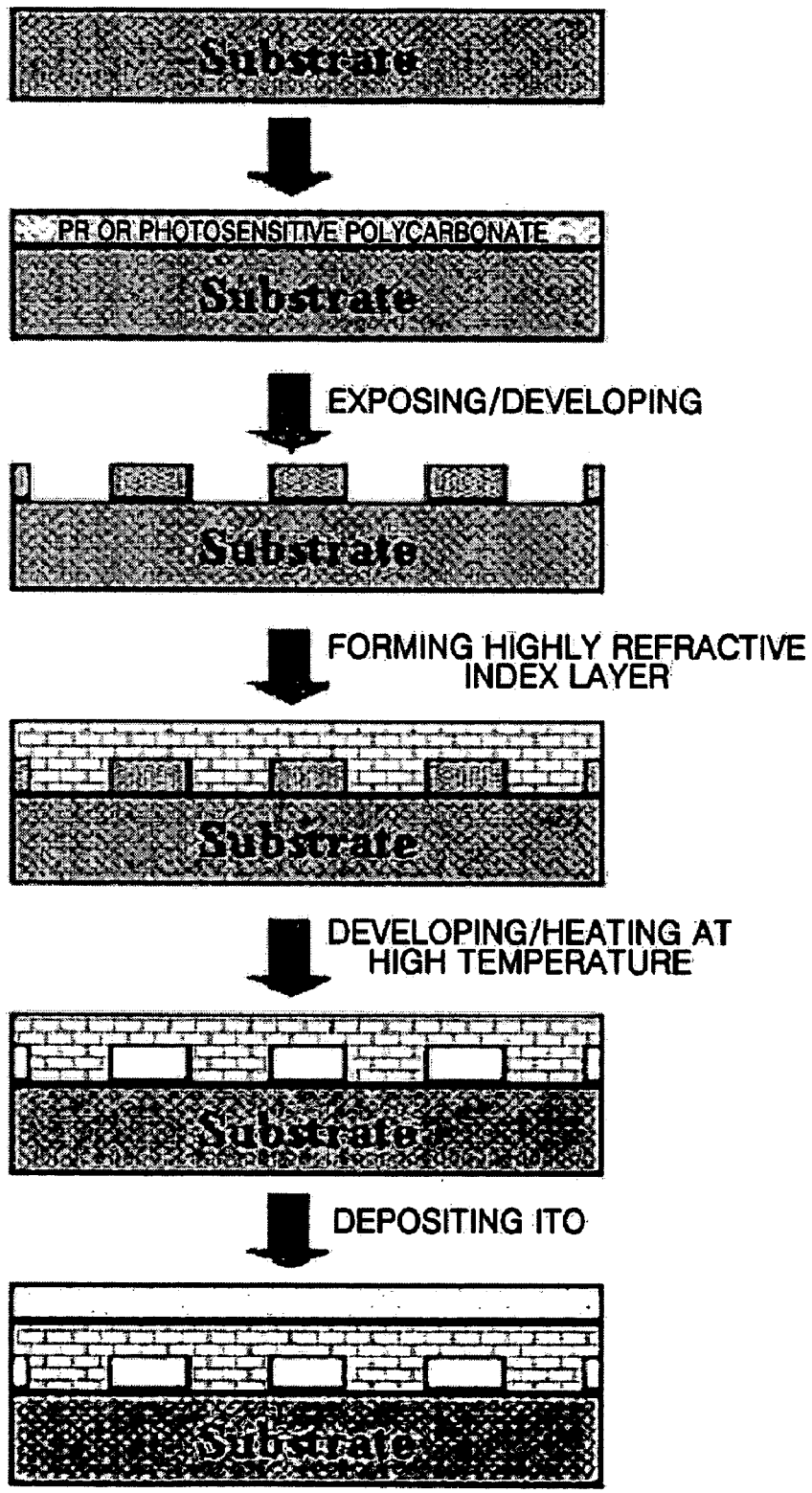
FIG. 4 is a schematic diagram showing a manufacturing process for the organic EL display device according to an exemplary embodiment of the present invention.

FIG. 4 is a schematic diagram showing a manufacturing process of the organic EL display device according to the present invention. Referring to FIG. 4, a photoresist composition may be coated on a substrate by spin coating and then exposed and developed to form a nano-grating layer on the substrate.

A commonly used composition may be used as the photoresist composition, such as a photosensitive polycarbonate resin enabling thermal decomposition. The thermal decomposition of the photosensitive polycarbonate may be carried out at a temperature in a range of about 200° C. to about 500° C. for about 30 minutes to about 3 hours.

A highly refractive layer may then be coated on the nano-grating layer. As described above, a material selected from the group consisting of SOG, $TiO_2$, and $Ta_2O_5$, may be used as the highly refractive layer. Thereafter, the nano-grating layer may be heated or wet-etched for removal, thereby forming a nano-porous layer. The heating may be carried out at a temperature of 400° C. or higher, preferably at a temperature in a range of 400° C. to 600° C.

After forming the nano-porous layer, the first electrode, the organic layer and the second electrode may be sequentially stacked on the highly refractive layer to form a seal layer, followed by adhering the rear substrate to a front substrate, thereby fabricating the organic EL display device.

Embodiment

Light Coupling Efficiency Depending on Refractive Index Difference Between Diffraction Grating Layers In the illustrative embodiment, a Finite Difference Time Domain (FDTD) simulation was used to compute and compare light coupling efficiencies depending on refractive index differences between diffraction grating layers.

The light coupling efficiency was computed using the following formula:

Light coupling efficiency $(x) = \frac{1}{2}(N_{out}/N_{in})^2$ where N is a refractive index of each layer.

Figure 5:
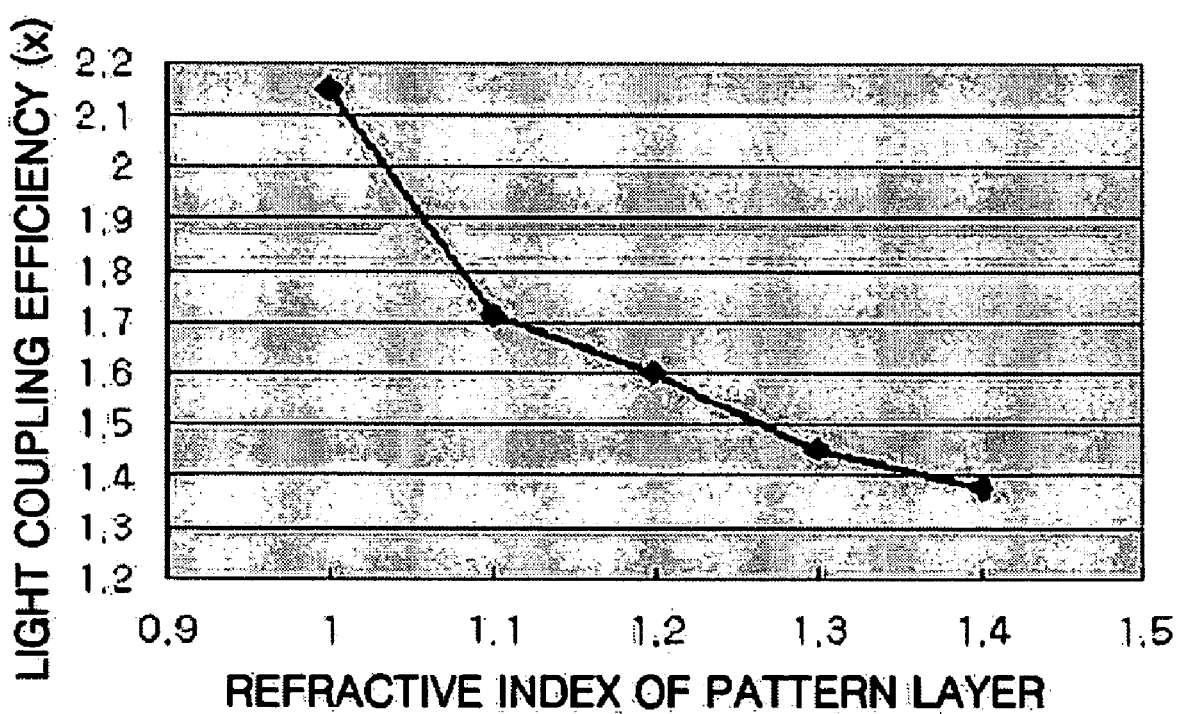
FIG. 5 is a graph showing light coupling efficiency depending on a refractive index difference between diffraction grating layers.

The light coupling efficiencies of material layers having refractive indexes of 1.1, 1.2, 1.3, and 1.4, respectively, were computed using the above formula and compared with the light coupling efficiency of the nano-porous layer having a refractive index of 1.0, according to the present invention. FIG. 5 shows the results.

Referring to FIG. 5, as the refractive index of the nano-porous layer decreases, the light coupling efficiency sharply increases. It may also be understood that the use of the nano-porous layer according to exemplary embodiments of the present invention may maximize the light coupling efficiency compared to the case of using any other existing low refractive index material layer. For example, as FIG. 5 shows, the light coupling efficiency of the nano-porous layer according to the present invention may be approximately twice that of the nano-grating layer made of a material having a refractive index of 1.2.

According to the organic EL display device of the present invention and the manufacturing method thereof, light coupling efficiency may be enhanced by maximizing a refractive index difference between diffraction grating layers, and the fabrication process may be easily performed.

It will be apparent to those skilled in the art that various modifications and variation can be made in the present invention without departing from the spirit or scope of the invention. Thus, it is intended that the present invention cover the modifications and variations of this invention provided they come within the scope of the appended claims and their equivalents.

What is claimed is:

1. An organic electroluminescent (EL) display device, comprising:
   a substrate;
   an organic EL portion formed on a surface of the substrate and including a first electrode, an organic layer, and a second electrode;
   a nano-porous layer; and
   a highly refractive layer,
   wherein the nano-porous layer and the highly refractive layer are interposed between the substrate and the first electrode,
   wherein the nano-porous layer is entirely arranged between the substrate and the highly refractive layer,
   wherein the nano-porous layer has a nano-pore arranged regularly at an interval of about 200 nm to about 1000 nm to form a diffraction grating, and
   wherein the nano-pore is about 20 nm to about 900 nm wide.

2. The organic EL display device of claim 1, wherein the nano-porous layer is about 1000 nm or less thick.

3. The organic EL display device of claim 1, wherein the highly refractive layer is about 2000 nm or less thick.

4. The organic EL display device of claim 1, wherein the highly refractive layer has a refractive index of 1.6 or higher.

5. The organic EL display device of claim 1, wherein the highly refractive layer is made of a material selected from the group consisting of Spin-On-Glass, $TiO_2$, and $Ta_2O_5$.

6. The organic EL display device of claim 1, wherein the first electrode is an indium tin oxide (ITO) electrode.

* * * * *